United States Patent [19]
Hadjichristos

[11] Patent Number: 5,847,623
[45] Date of Patent: Dec. 8, 1998

[54] LOW NOISE GILBERT MULTIPLIER CELLS AND QUADRATURE MODULATORS

[75] Inventor: Aristotle Hadjichristos, Cary, N.C.

[73] Assignee: Ericsson Inc., Research Triangle Park, N.C.

[21] Appl. No.: 925,572

[22] Filed: Sep. 8, 1997

[51] Int. Cl.[6] .............................. H03C 1/36; H04B 1/28; H04L 27/04; H04L 27/36
[52] U.S. Cl. .......................... 332/105; 327/119; 327/359; 332/159; 332/178; 375/261; 375/298; 455/333
[58] Field of Search ..................................... 332/103, 105, 332/178, 159; 327/116, 119, 356, 357, 359; 455/333; 375/261, 298

[56] References Cited

U.S. PATENT DOCUMENTS

| | | | |
|---|---|---|---|
| 5,379,457 | 1/1995 | Nguyen | 455/323 |
| 5,574,755 | 11/1996 | Persico | 375/295 |
| 5,625,307 | 4/1997 | Scheinberg | 455/333 |

OTHER PUBLICATIONS

Gray et al., "Analysis and Design of Analog Integrated Circuit, Third Edition", John Wiley & Sons, Inc., 1993, pp. 670–675.

Primary Examiner—Siegfried H. Grimm
Attorney, Agent, or Firm—Myers Bigel Sibley & Sajovec

[57] ABSTRACT

A Gilbert Multiplier Cell includes an emitter-coupled transistor pair and a pair of cross-coupled emitter-coupled transistor pairs. A filter couples the emitter-coupled transistor pair to the pair of the cross-coupled emitter-coupled transistor pairs. The filter may include a pair of inductors or resistors, a respective one of which serially couples a respective one of the emitter-coupled transistor pair to a respective one of the pair of cross-coupled emitter-coupled transistor pairs, and a capacitor connected between the pair of inductors or resistors. A local oscillator is coupled to the pair of cross-coupled emitter-coupled transistor pairs and a data input is coupled to the emitter-coupled transistor pair. By low pass filtering the output of the emitter-coupled transistor pair that is applied to the pair of cross-coupled emitter-coupled transistor pairs, low noise floor Gilbert Multiplier Cells and quadraphase modulators may be provided.

20 Claims, 2 Drawing Sheets

LOW NOISE GILBERT MULTIPLIER CELLS AND QUADRATURE MODULATORS

FIELD OF THE INVENTION

This invention relates to modulator or mixer circuits and related methods, and more particularly to Gilbert cell modulators and related methods.

BACKGROUND OF THE INVENTION

Modulators are widely used in radio frequency transmitters to modulate a data input such as a voice input, onto a carrier frequency. Modulators are also referred to as "mixers" or "multipliers". For example, in a mobile radiotelephone, a modulator is used for the radiotelephone transceiver.

A particular type of modulator which is widely used is the "Gilbert Multiplier Cell", also referred to as the "Gilbert Modulator", the "Gilbert Cell" or the "Gilbert Mixer". The Gilbert Multiplier Cell includes an emitter-coupled transistor pair, also referred to as the lower transistors or driver transistors, which is coupled to a pair of cross-coupled emitter-coupled transistor pairs, also referred to as the upper transistors, switch transistors or active mixer transistors. A data input, which can include an analog or digital voice or data input, is coupled to the emitter-coupled transistor pair. A local oscillator is coupled to the pair of cross-coupled emitter-coupled transistor pairs, to produce a modulated output. The Gilbert Multiplier Cell is extensively described and analyzed in Section 10.3 of the textbook "*Analysis and Design of Analog Integrated Circuits*" by Paul Gray and Robert Meyer, John Wiley and Sons, N.Y., 1993, pp. 670–675, the disclosure of which is hereby incorporated herein by reference.

In modern communications systems, it is increasingly important to provide low noise Gilbert Multiplier Cells. For example, in a mobile radiotelephone, such as a cellular telephone, it is important for the transmitter to reject noise which is generated in the receive band. This noise rejection may be accomplished by using surface acoustic wave (SAW) filters at the output of the Gilbert Multiplier Cell.

Unfortunately, SAW filters may be expensive and may consume excessive circuit board area, which may limit the size of the mobile radiotelephone. Moreover, the SAW filter's bandpass may need to be tailored for the specific radio bandwidth which may differ among different radiotelephone systems, such as AMPS, DAMPS and PCS. Accordingly, multiple SAW filters may need to be used in dual band telephones.

One solution for reducing the noise in a Gilbert Multiplier Cell is described in U.S. Pat. No. 5,379,457 to Nguyen entitled "Low Noise Active Mixer". As described, noise degradation is reduced over a conventional Gilbert Multiplier Cell active mixer by replacing the standard radio frequency emitter degeneration resistor with a reactive element, thereby reducing thermal noise. Narrow-band input matching is achieved by insertion of a series inductive element and optional parallel capacitive element in line with the radio frequency input.

A pair of Gilbert Multiplier Cells may be used to produce a quadraphase modulator, also known as an IC/IQ modulator or an I/Q quadrature modulator. A quadraphase modulator is described in U.S. Pat. No. 5,574,755, to Persico entitled "I/Q Quadraphase Modulator Circuit". A quadraphase modulator generally includes a quadrature splitter, also known as a 90° phase shifter, and a pair of Gilbert Cells coupled to the quadrature splitter. A local oscillator is coupled to the quadrature splitter to produce 90° phase shifted local oscillator signals for the respective Gilbert Cells. I-data and Q-data are coupled to the respective Gilbert Cells, and the outputs of the Gilbert Cells are combined to produce an I/Q modulated output.

As already described, low noise operation of a quadraphase modulator is also becoming increasingly important in modern day radio-communications systems. Accordingly, there continues to be a need for low noise Gilbert Cells and quadraphase modulators.

SUMMARY OF THE INVENTION

It is therefore an object of the present invention to provide improved Gilbert Multiplier Cells, quadraphase modulators and related modulating methods.

It is another object of the present invention to provide Gilbert Multiplier Cells and quadraphase modulators and methods which can provide low noise modulated outputs.

It is yet another object of the present invention to provide low noise Gilbert Multiplier Cells and quadraphase modulators and methods which can provide low noise outputs without the need for surface acoustic wave filters at the outputs thereof.

These and other objects are provided, according to the invention, by Gilbert Multiplier Cells and quadraphase modulators which include a filter that couples the emitter-coupled transistor pair to the pair of cross-coupled emitter-coupled transistor pairs. The filter is preferably a low-pass filter having a cutoff frequency which filters frequencies above the cutoff frequency. The filter may be implemented by a pair of inductors or resistors, a respective one of which serially couples a respective one of the emitter-coupled transistor pair to a respective one of the pair of cross-coupled emitter-coupled transistor pairs, and a capacitor connected between the pair of inductors or resistors. The inductors may be implemented using integrated circuit spiral inductors and the capacitor may be a discrete capacitor. Gilbert Multiplier Cells and quadraphase modulators according to the invention can provide a low noise floor without requiring expensive bandpass SAW filters at the output of Gilbert Multiplier Cells or quadraphase modulators. Moreover, even if SAW filters are used, fewer SAW filters may be needed.

The invention stems from the realization that since the pair of cross-coupled emitter-coupled transistor pairs is operating as a switch in a Gilbert Multiplier Cell, the noise contribution of these devices is generally small. Accordingly, most of the noise in the Gilbert Multiplier Cell is due to the emitter-coupled transistor pair that supplies the signal to the pair of cross-coupled emitter-coupled transistor pairs. Thus, if the noise contribution of the emitter-coupled transistor pair is filtered and not allowed to mix with the local oscillator that switches on and off the pair of cross-coupled emitter-coupled transistor pairs, then the noise of the Gilbert Multiplier Cell can be made very low, without requiring extensive filtering at the output of the Gilbert Multiplier Cell.

Gilbert Multiplier Cells according to the present invention include an emitter-coupled transistor pair and a pair of cross-coupled emitter-coupled transistor pairs. A low pass filter couples the emitter-coupled transistor pair to the pair of cross-coupled emitter-coupled transistor pairs. Gilbert Multiplier Cells according to the invention further comprise a local oscillator which is coupled to the pair of cross-coupled emitter-coupled transistor pairs, and a data input which is coupled to the emitter-coupled transistor pair.

The low pass filter preferably comprises a pair of inductors or resistors, a respective one of which serially couples a respective one of the emitter-coupled transistor pair to a respective one of the pair of cross-coupled emitter-coupled transistor pairs, and a capacitor connected between the pair of inductors or resistors. The low pass filter preferably has a cutoff frequency which filters frequencies above the cutoff frequency.

The Gilbert Multiplier Cell is preferably fabricated in an integrated circuit substrate, so that the emitter-coupled transistor pair and the pair of cross-coupled emitter-coupled transistor pairs are included in the integrated circuit substrate. The pair of inductors or resistors are also preferably included in the integrated circuit substrate, whereas the capacitor is preferably a discrete capacitor which is not included in the integrated circuit substrate. The pair of inductors may be embodied as a pair of integrated circuit spiral inductors.

Quadraphase modulators may be provided according to the invention, using a quadrature splitter and a pair of Gilbert Multiplier Cells which are coupled to the quadrature splitter. Each of the Gilbert Multiplier Cells includes an emitter-coupled transistor pair, a pair of cross-coupled emitter-coupled transistor pairs and a filter that couples the emitter-coupled transistor pair to the pair of cross-coupled emitter-coupled transistor pairs. A local oscillator is coupled to the quadrature splitter, so that the quadrature splitter generates a pair of phase shifted outputs, a respective one of which is coupled to the pair of cross-coupled emitter-coupled transistor pairs and to a respective one of the pair of Gilbert Multiplier Cells. I- and Q-data inputs are also provided, a respective one of which is coupled to a respective one of the emitter-coupled transistor pairs and to a respective one of a pair of Gilbert Multiplier Cells. The pairs of cross-coupled transistor pairs in each of the Gilbert Multiplier Cells are coupled together to provide an I/Q modulated output.

Accordingly, noise may be reduced in a Gilbert Multiplier Cell by filtering the output of the emitter-coupled transistor pair that is applied to the pair of cross-coupled emitter-coupled transistor pairs. Low pass filtering is preferably employed to filter frequencies above a cutoff frequency. Low noise floor Gilbert Multiplier Cells and quadraphase modulators are thereby provided.

DETAILED DESCRIPTION OF THE DRAWINGS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
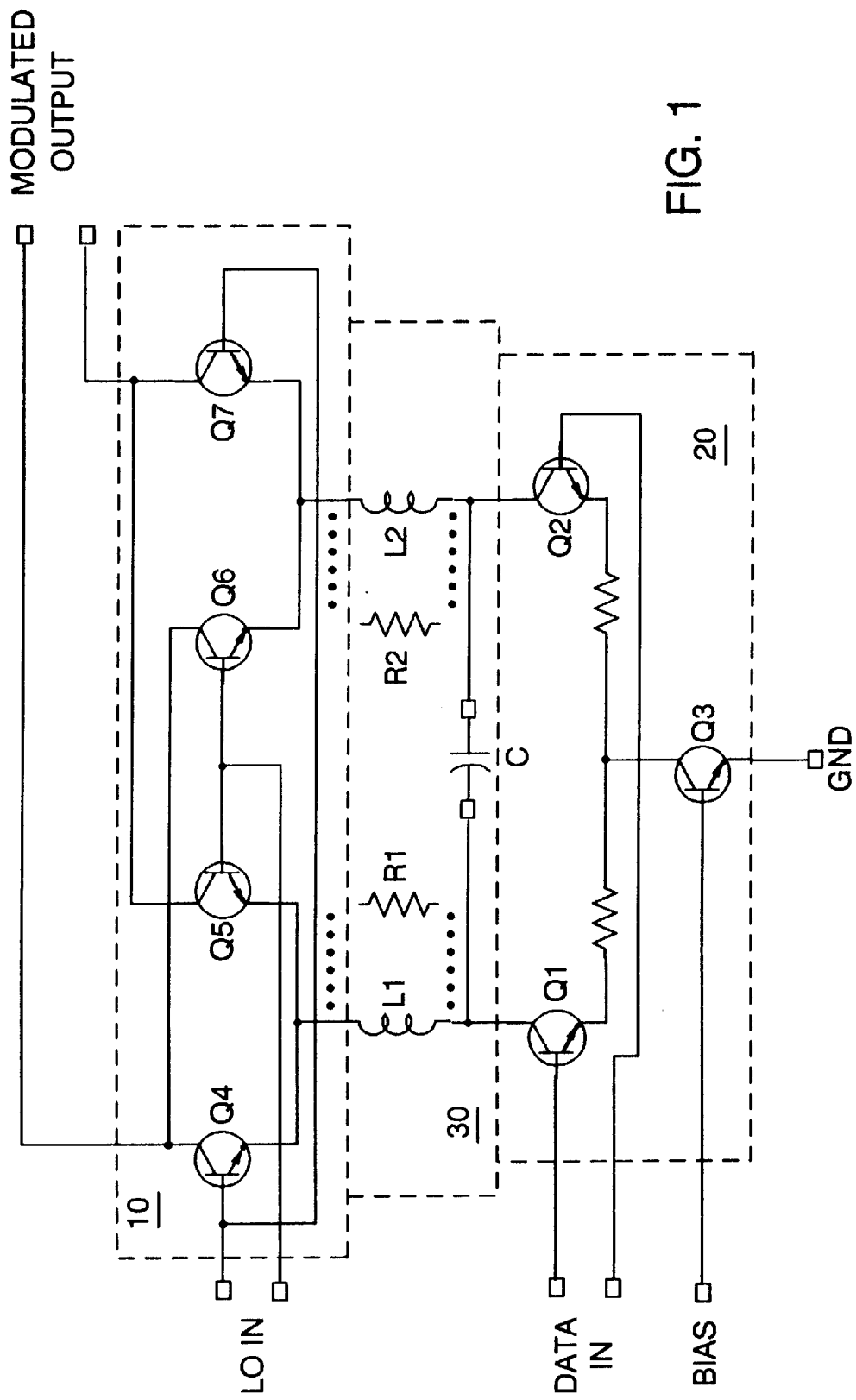
FIG. 1 is a circuit diagram of Gilbert Multiplier Cells according to the present invention.

Referring now to FIG. 1, a Gilbert Multiplier Cell according to the present invention is illustrated. As shown in FIG. 1, the Gilbert Multiplier Cell includes an upper transistor cell (switching block) 10, a lower transistor cell (driver block) 20 and a filter 30. The upper transistor cell includes a pair of cross-coupled emitter-coupled transistor pairs. Transistors Q4 and Q5 comprise one of the pair of cross-coupled emitter-coupled transistor pairs, and transistors Q6 and Q7 comprise the other of the pair of cross-coupled emitter-coupled transistor pairs. As also shown, a local oscillator input "LO IN" is coupled to the pair of cross-coupled emitter-coupled transistor pairs. The pair of cross-coupled emitter-coupled transistor pairs produce a modulated output.

The lower transistor cell 20 includes an emitter-coupled transistor pair Q1 and Q2 to which a data input DATA IN is applied. A bias transistor Q3 is responsive to a BIAS input. The design of blocks 10 and 20 to form a Gilbert Multiplier Cell are well known to those having skill in the art and need not be described further herein.

According to the invention, a filter 30 couples the emitter-coupled transistor pair Q1, Q2 to the pair of cross-coupled emitter-coupled transistor pairs Q4, Q5 and Q6, Q7. As shown in FIG. 1, filter 30 includes a pair of inductors L1 and L2 or a pair of resistors R1, R2, a respective one of which serially couples a respective transistor Q1, Q2 in the emitter-coupled transistor pair to a respective one of the pair of cross-coupled emitter-coupled transistor pairs Q4, Q5 and Q6, Q7. A capacitor C is connected between the pair of inductors or resistors. Both inductors and resistors may also be used. The filter 30 is used to reduce and preferably remove the out-of-band noise which would otherwise reach the pair of cross-coupled emitter-coupled transistor pairs. Thus, the in-band noise figure of the Gilbert Multiplier Cell may remain unchanged from its typical value of 12–17 dB. However, the out-of-band noise may be reduced greatly.

In a preferred embodiment, the two inductors L1 and L2 which are placed in series with the collectors of the lower transistor cell, can have values between about 10–15 nH. They can be implemented as spiral inductors in the integrated circuit substrate which is used for the Gilbert Multiplier Cell. If resistors R1 and R2 are used, they can have values of about 50Ω. The capacitor C may be an external capacitor having a value of 5000 pF if the cutoff frequency of the low pass filter is below several tens of MHz. In particular, if the data frequency is less than 30 KHz, the cutoff frequency can be set to 100 KHz or more, and the low pass filter will reject noise at 45 MHz.

Accordingly, L1 and L2 are radio frequency (RF) chokes which can prevent the RF signal from being shunted by capacitor C. The same function may be accomplished by resistors R1 and R2. Capacitor C filters out the high frequency components of noise from transistors Q1, Q2 and Q3.

Figure 2:
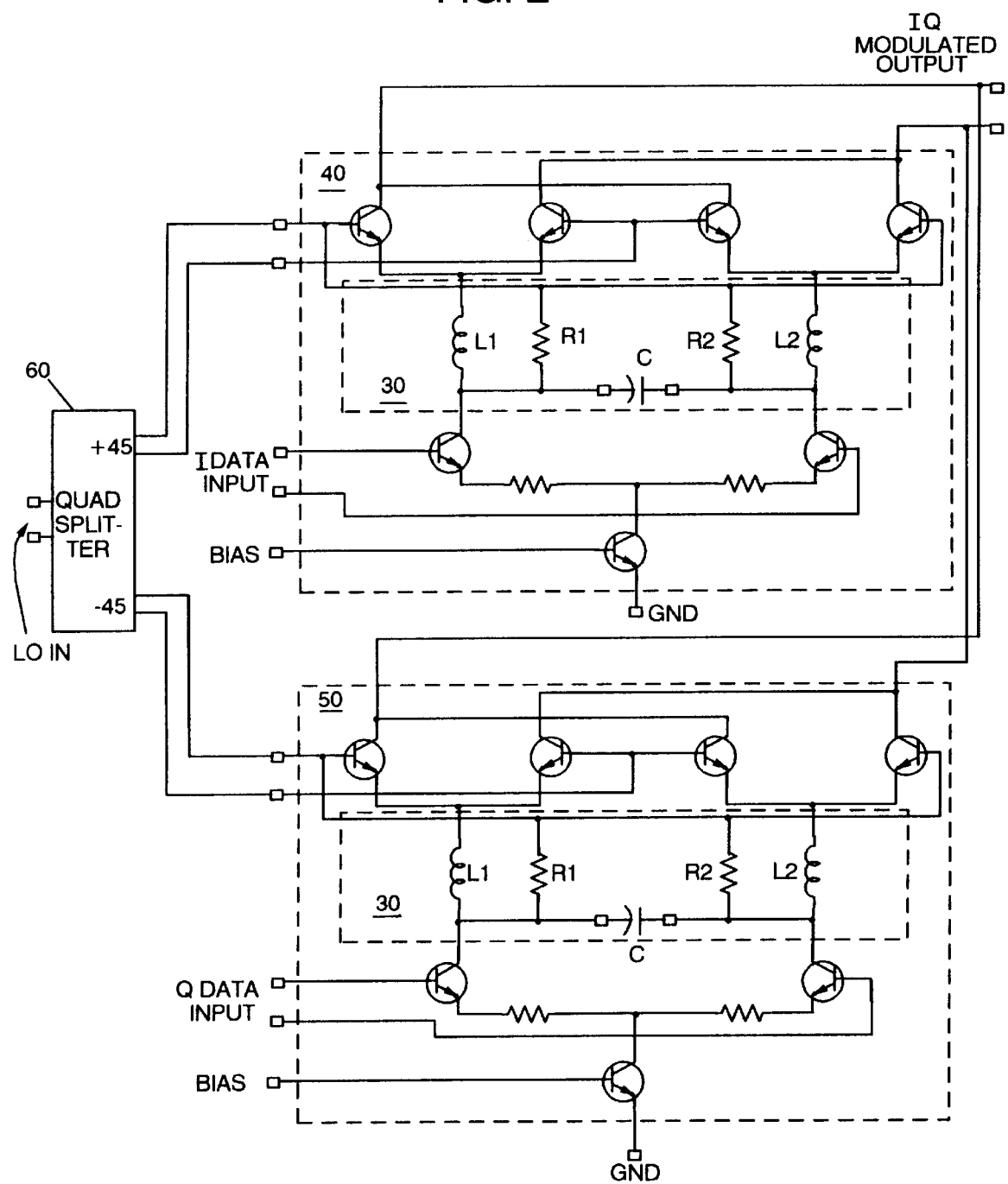
FIG. 2 is a circuit diagram of quadraphase modulators according to the present invention.

FIG. 2 illustrates a low noise quadrature modulator which may be implemented using two Gilbert Multiplier cells and a quadrature splitter according to the present invention. The entire modulator can be implemented in an integrated circuit with a pair of discrete capacitors.

Referring now to FIG. 2, an I/Q modulator according to the present invention includes a first and a second Gilbert Multiplier Cell 40 and 50 respectively, and a quadrature splitter 60. The local oscillator is coupled to the quadrature splitter 60 which provides phase shifted local oscillator outputs to the respective Gilbert Multiplier Cells 40 and 50. An I-data input is provided for Gilbert Multiplier Cell 40 and a Q-data input is provided for Gilbert Multiplier Cell 50. The outputs of the Gilbert Multiplier Cells 40 and 50 are coupled together to provide an I/Q modulated output. The designs of the Gilbert Multiplier Cells 40 and 50 may be as described in connection with FIG. 1 and need not be described again.

Accordingly, noise in Gilbert Multiplier Cells may be reduced by filtering the output of the emitter-coupled transistor pair that is applied to the pair of cross-coupled emitter-coupled transistor pairs. Low noise floor Gilbert Multiplier Cells and quadraphase multipliers may thereby be provided without the need to use expensive and large SAW devices at the output.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A Gilbert Multiplier Cell comprising:
   an emitter-coupled transistor pair;
   a pair of cross-coupled emitter-coupled transistor pairs; and
   a filter that couples the emitter-coupled transistor pair to the pair of cross-coupled emitter-coupled transistor pairs.

2. Gilbert Multiplier Cell according to claim 1 wherein the filter comprises:
   a pair of inductors or resistors, a respective one of which serially couples a respective one of the emitter-coupled transistor pair to a respective one of the pair of cross-coupled emitter-coupled transistor pairs; and
   a capacitor connected between the pair of inductors or resistors.

3. A Gilbert Multiplier Cell according to claim 2 further comprising an integrated circuit substrate;
   wherein the emitter-coupled transistor pair and the pair of cross-coupled emitter-coupled transistor pairs are included in the integrated circuit substrate;
   wherein the pair of inductors or resistors are included in the integrated circuit substrate; and
   wherein the capacitor is a discrete capacitor that is not included in the integrated circuit substrate.

4. A Gilbert Multiplier Cell according to claim 3 wherein the pair of inductors are a pair of integrated circuit spiral inductors.

5. A Gilbert Multiplier Cell according to claim 1 further comprising:
   a local oscillator that is coupled to the pair of cross-coupled emitter-coupled transistor pairs; and
   a data input that is coupled to the emitter-coupled transistor pair.

6. A Gilbert Multiplier Cell according to claim 1 wherein the filter is a low pass filter having a cutoff frequency that filters frequencies above the cutoff frequency.

7. A Gilbert Multiplier Cell according to claim 5 wherein the local oscillator oscillates at mobile radiotelephone frequencies and wherein the data input is a mobile radiotelephone data input.

8. A quadraphase modulator comprising:
   a quadrature splitter; and
   a pair of Gilbert Multiplier Cells coupled to the quadrature splitter, each of the Gilbert Multiplier Cells comprising:
      an emitter-coupled transistor pair;
      a pair of cross-coupled emitter-coupled transistor pairs; and
      a filter that couples the emitter-coupled transistor pair to the pair of cross-coupled emitter-coupled transistor pairs.

9. A quadraphase modulator according to claim 8 wherein the filter comprises:
   a pair of inductors or resistors, a respective one of which serially couples a respective one of the emitter-coupled transistor pair to a respective one of the pair of cross-coupled emitter-coupled transistor pairs; and
   a capacitor connected between the pair of inductors or resistors.

10. A quadraphase modulator according to claim 9 further comprising an integrated circuit substrate;
    wherein the emitter-coupled transistor pair and the pair of cross-coupled emitter-coupled transistor pairs of each of the Gilbert Multiplier Cells are included in the integrated circuit substrate;
    wherein the pair of inductors or resistors of each of the Gilbert Multiplier Cells are included in the integrated circuit substrate; and
    wherein the capacitor of each of the Gilbert Multiplier Cells is a discrete capacitor which is not included in the integrated circuit substrate.

11. A quadraphase modulator according to claim 10 wherein the pair of inductors of each of the Gilbert Multiplier Cells are a pair of integrated circuit spiral inductors.

12. A quadraphase modulator according to claim 8 further comprising:
    a local oscillator that is coupled to the quadrature splitter;
    the quadrature splitter generating a pair of phase shifted outputs, a respective one of which is coupled to the pair of cross-coupled emitter-coupled transistor pairs in a respective one of the pair of Gilbert Multiplier Cells; and
    I and Q data inputs, a respective one of which is coupled to a respective one of the emitter-coupled transistor pairs in a respective one of the pair of Gilbert Multiplier Cells.

13. A quadraphase modulator according to claim 8 wherein each of the filters is a low pass filter having a cutoff frequency that filters frequencies above the cutoff frequency.

14. A quadraphase modulator according to claim 8 wherein the pairs of cross-coupled transistor pairs in each of the Gilbert Multiplier Cells are coupled together to provide an IQ modulated output.

15. A quadraphase modulator according to claim 12 wherein the local oscillator oscillates at mobile radiotelephone frequencies and wherein the I and Q data inputs are mobile radiotelephone data inputs.

16. A method of reducing noise in a Gilbert Multiplier Cell, the Gilbert Multiplier Cell comprising an emitter-coupled transistor pair, the output of which is coupled to a pair of cross-coupled emitter-coupled transistor pairs, the noise reducing method comprising the step of:
    filtering the output of the emitter-coupled transistor pair that is applied to the pair of cross-coupled emitter-coupled transistor pairs.

17. A method according to claim 16 wherein the filtering step comprises the step of low pass filtering the output of the emitter-coupled transistor pair, to filter frequencies above a cutoff frequency.

18. A method according to claim 17 wherein the low pass filtering step comprises the steps of:
    serially coupling an inductor or resistor between the emitter-coupled transistor pair and each of the pair of cross-coupled emitter-coupled transistor pairs; and
    coupling a capacitor between the inductors or resistors.

19. A method according to claim 16 further comprising the steps of:
    coupling a data input to the emitter-coupled transistor pair; and
    coupling a local oscillator to the pair of cross-coupled transistor pairs.

20. A method according to claim 19 wherein the local oscillator is a mobile radiotelephone local oscillator and wherein the data input is a mobile radiotelephone data input.

* * * * *